United States Patent [19]
Yallup et al.

[11] Patent Number: 5,479,048
[45] Date of Patent: Dec. 26, 1995

[54] INTEGRATED CIRCUIT CHIP SUPPORTED BY A HANDLE WAFER AND PROVIDED WITH MEANS TO MAINTAIN THE HANDLE WAFER POTENTIAL AT A DESIRED LEVEL

[75] Inventors: Kevin Yallup; Oliver Creighton, both of Limerick, Ireland

[73] Assignee: Analog Devices, Inc., Norwood, Mass.

[21] Appl. No.: 192,162

[22] Filed: Feb. 4, 1994

[51] Int. Cl.⁶ .............. H01L 23/48; H01L 29/40
[52] U.S. Cl. .............. 257/621; 257/350; 257/774
[58] Field of Search .................. 257/347, 348, 257/350, 621, 622, 773, 774

[56] References Cited

U.S. PATENT DOCUMENTS

| | | | |
|---|---|---|---|
| 4,924,284 | 5/1990 | Beyer et al. | 257/508 |
| 5,218,213 | 6/1993 | Gaul et al. | 257/347 |
| 5,240,876 | 8/1993 | Gaul et al. | 257/347 |
| 5,281,840 | 1/1994 | Sarma | 257/352 |

*Primary Examiner*—Rolf Hille
*Assistant Examiner*—David Ostrowski
*Attorney, Agent, or Firm*—Parmelee, Bollinger & Bramblett

[57] ABSTRACT

An SOI/DI IC chip including a handle wafer in the form of a section of silicon substrate contiguous with the layer of insulation beneath the silicon slice containing the device regions separated by trenches filled with low-conductivity polysilicon dielectric. One of the trenches is etched through the layer of insulation, and the polysilicon in that trench is doped to provide desired electrical conductivity to establish electrical contact with the handle wafer. Metallization is applied over the top of this one trench to make possible electrical connection to the handle wafer from above the chip by use of conventional wiring techniques.

4 Claims, 4 Drawing Sheets

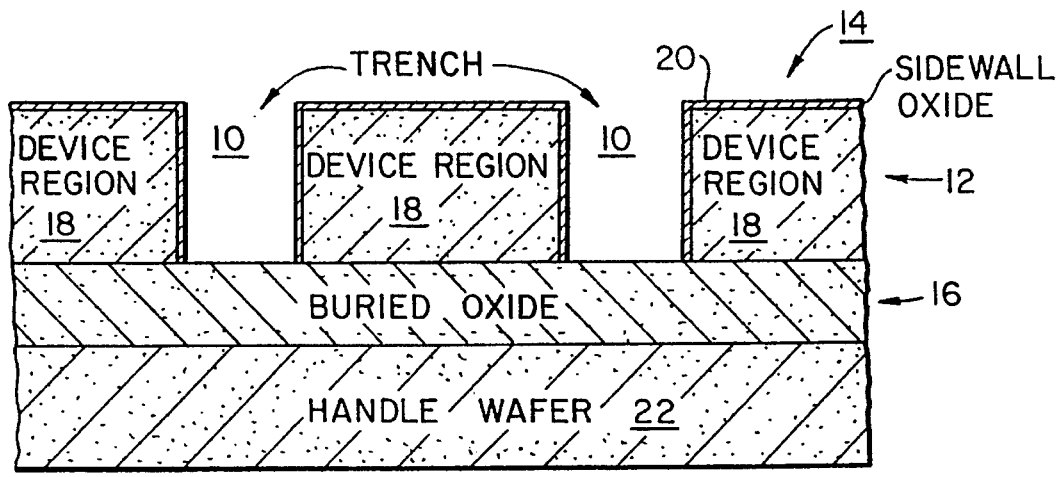
FIG. 1A
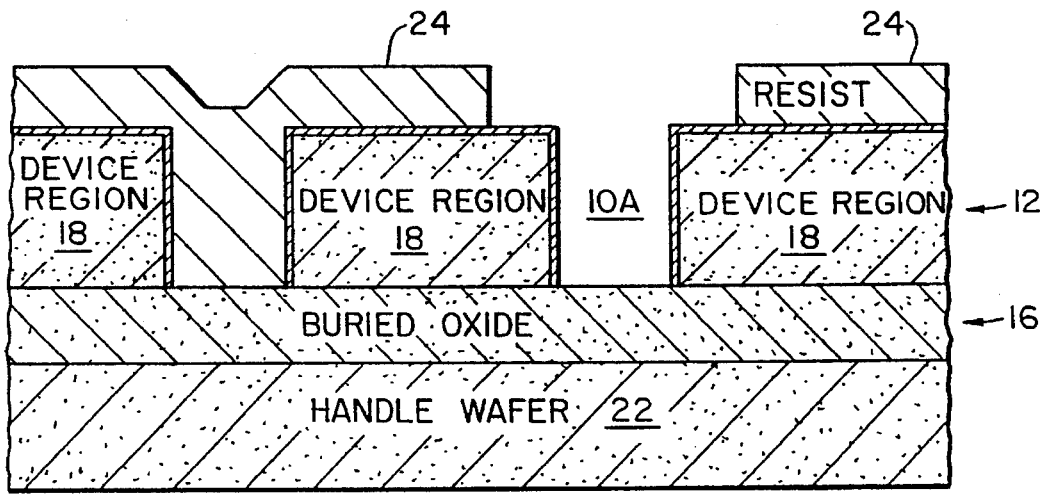
FIG. 1B
FIG. 1C
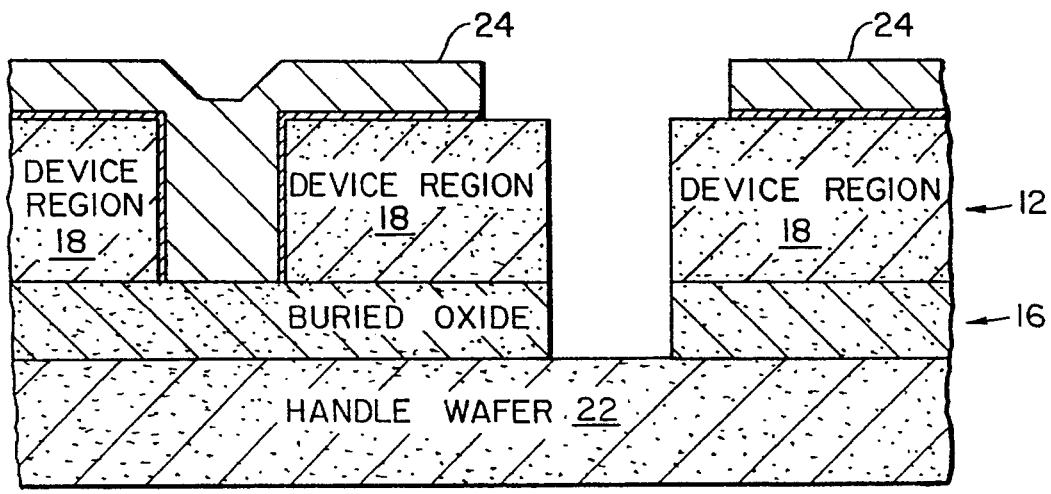

5,479,048

INTEGRATED CIRCUIT CHIP SUPPORTED BY A HANDLE WAFER AND PROVIDED WITH MEANS TO MAINTAIN THE HANDLE WAFER POTENTIAL AT A DESIRED LEVEL

BACKGROUND OF THE INVENTION

1. Field of the Invention

This invention relates to integrated circuit (IC) chips including a handle wafer support. More particularly, this invention relates to an improved technique and chip structure for fixing the potential of the handle wafer at a desired level.

2. Description of the Prior Art

Integrated circuits often are formed in a semiconductive silicon substrate having device regions (or "tubs") for corresponding elements of the circuit, both active and passive. Such device regions generally are electrically isolated from one another as by means of dielectric isolation (DI). The section of the silicon substrate containing the device regions can be pictured as a horizontal slice, and commonly is provided at its lower surface with an insulative layer ("buried oxide"). Such composite structure is often referred to as silicon-on-insulation (SOI). The insulative layer is, in turn, frequently supported on a section or slice of the substrate referred to as the handle wafer. The handle wafer generally is made of silicon and among other things serves to hold the isolated device tubs in fixed positions with respect to each other.

One feature of dielectric isolation is that the silicon regions surrounding the isolation regions (either device tubs or the handle wafer) can electrically couple to each other through the isolation in such a way that the operation of devices in the device regions can be modified. Furthermore, in the absence of any current path to ground, it is possible for charge to accumulate in the handle wafer, eventually leading to electrostatic damage to the isolation regions. Accordingly, it is desired to provide means for controlling the potential and accumulated charge in the handle wafer, as by means of an electrical connection to the handle wafer section.

In conventional SOI wafer processing, such connection to the handle wafer is not readily made with the normal contact formation processes that are used with circuit elements fabricated on a substrate because the handle wafer is buried beneath the device regions in all parts of the substrate, and therefore not reachable from above. It is of course possible to gain access to the handle wafer from above by arranging the handle wafer to surround the device tubs on three sides, with the upper surface of the handle wafer being coplanar with the surface of the adjacent device regions. However, although this makes it possible to use conventional contact-making processes to establish connection to the handle wafer, such an arrangement is unsatisfactory because it requires that the handle wafer surface be in some places alongside of the upper surfaces of the device regions, and this restriction interferes with achieving other important goals.

SUMMARY OF THE INVENTION

In one preferred embodiment of the invention, to be described hereinbelow in detail, connection is made to the handle wafer through a polysilicon-filled contact trench the upper surface of which is in electrical contact with metallization applied to the IC chip. The lower section of this contact trench extends down through the underlying layer of insulation beneath the device regions, this layer being selectively etched to clear a path for the trench filling so that it can engage and make electrical connection to the handle wafer. Electrical connection can advantageously be made from above to the metallization overlying the contact trench by using standard contact-formation processes which at the same time are employed to make contact with the device regions of the integrated circuit.

With this configuration, the electrical potential of the buried handle wafer can be controlled by an external connection passing through a pin on the chip package to the metallization overlying the contact trench. Accordingly, by such means the desired result of a controlled potential for the handle wafer can be obtained using chip-forming processes compatible with the normal IC-forming and contact-making processes generally employed for SOI/DI chips.

Other objects, aspects and advantages of the invention will in part be pointed out in, and in part apparent from, the following detailed description of a preferred embodiment of the invention, considered together with the accompanying drawings.

BRIEF DESCRIPTION OF THE DRAWINGS

FIGS. 1A through 1F show section views of a portion of an IC chip at successive stages of the forming process;

DETAILED DESCRIPTION OF A PREFERRED EMBODIMENT

Figure 1D:
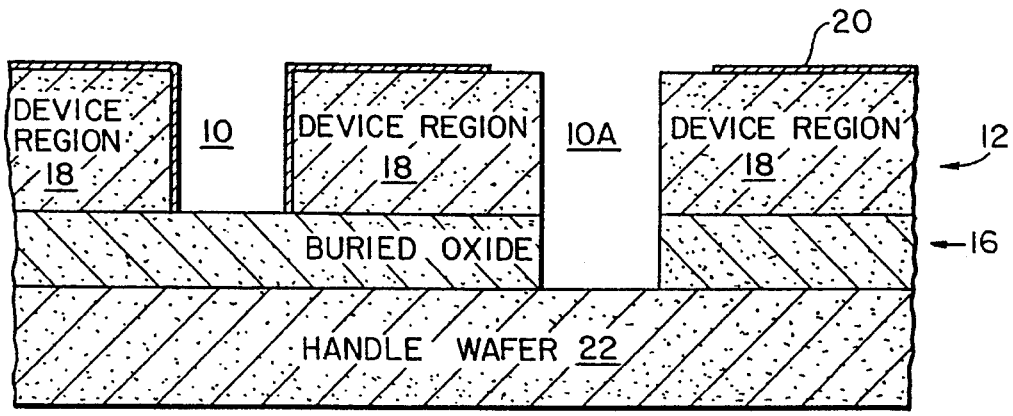

Referring first to FIG. 1A, in a presently preferred embodiment of the invention, the formation of an SOI/DI chip includes the step of etching trenches 10 in the upper section 12 (usually silicon) of a substrate generally indicated at 14. Although only two trenches are shown, it will be understood that generally a quite large number of trenches will be formed. These trenches initially all extend down to a buried layer of insulation 16, typically silicon dioxide, and establish separate device regions 18 for IC circuit elements.

A thin layer of oxide 20 then is formed on the walls of the trenches 10 and on the upper surface of the horizontal substrate section 12. Most of these trenches ultimately will be filled with material which is not highly conductive, and which together with the trench sidewall oxide 20 establishes the required isolation barriers between the device regions 18.

Supporting the buried oxide 16 and secured thereto is a second horizontal section 22 of the substrate 14, typically doped silicon, and serving as the handle wafer. Referring now to FIG. 1B, photoresist 24 is applied to the upper surfaces of the substrate, and thereafter is removed from the region of one of the trenches 10A which is destined to become a contact trench for the handle wafer 20. Referring also to FIG. 1C, etching then is carried out to remove the underlying dielectric layer 16 in the region beneath the trench 10A, and to remove as well the side wall oxide layers 20 associated with that trench, together with a portion of the oxide 20 on the horizontal upper shoulder region adjacent the trench 10A.

Figure 1E:
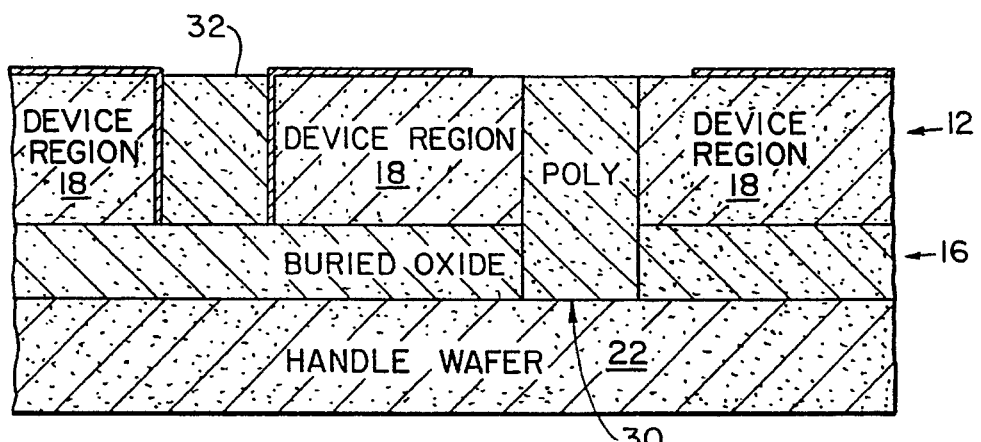

Turning now to FIG. 1D, the remaining photoresist then is removed and (see FIG. 1E) polysilicon is applied as a blanket over the entire wafer, and then is etched away from the horizontal surface of the wafer leaving polysilicon 30 in the trench 10A to a level coplanar with the adjacent device regions. This trench filling is subsequently doped with an impurity such as phosphorous or boron (depending upon the electrical characteristic of the associated silicon), as will be explained hereafter, to provide good conductivity of the polysilicon. The bottom of the polysilicon fill engages the handle wafer 22 to establish low-resistance electrical contact therewith. The other trenches 10 also are filled with polysilicon 32, but this poly is not doped to enhance its conductivity since the trenches 10 are to serve, together with the side wall oxide 20, as insulated barriers to isolate adjacent device regions of the substrate.

Figure 1F:
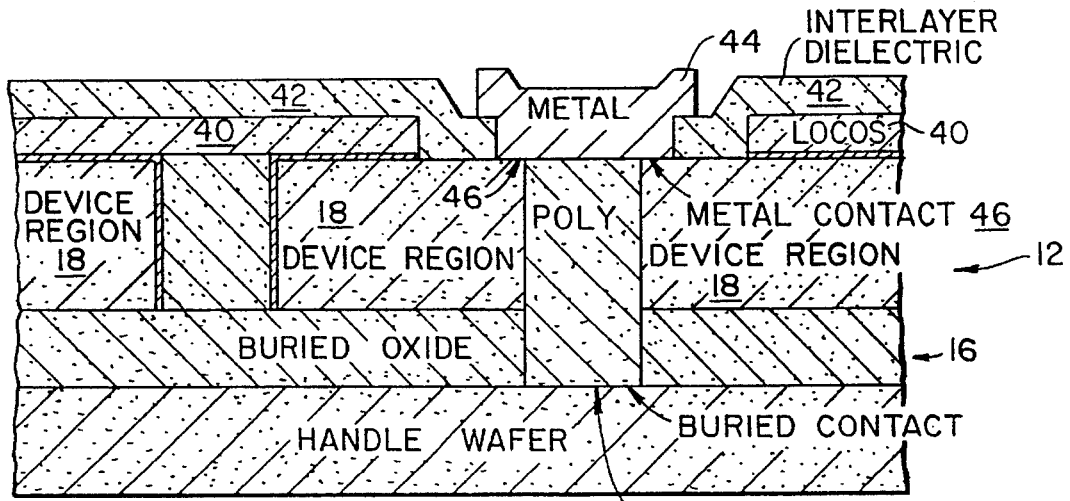

Referring next to FIG. 1F, in the preferred embodiment a layer of oxide 40 (LOCOS, for "local oxidation of silicon") is thermally grown over the substrate, except in regions adjacent the trench 10A. Similarly, interlayer dielectric 42 is deposited (as from Silane) in the usual fashion. Metallization 44 is applied over the upper surface of the polysilicon filling 30 to establish electrical contact with the polysilicon, and through that filling with the handle wafer 22. The metal 44 also makes electrical contact with the horizontal shoulder regions 46 of the substrate section 12 which are adjacent the trench 10A.

Figure 2:
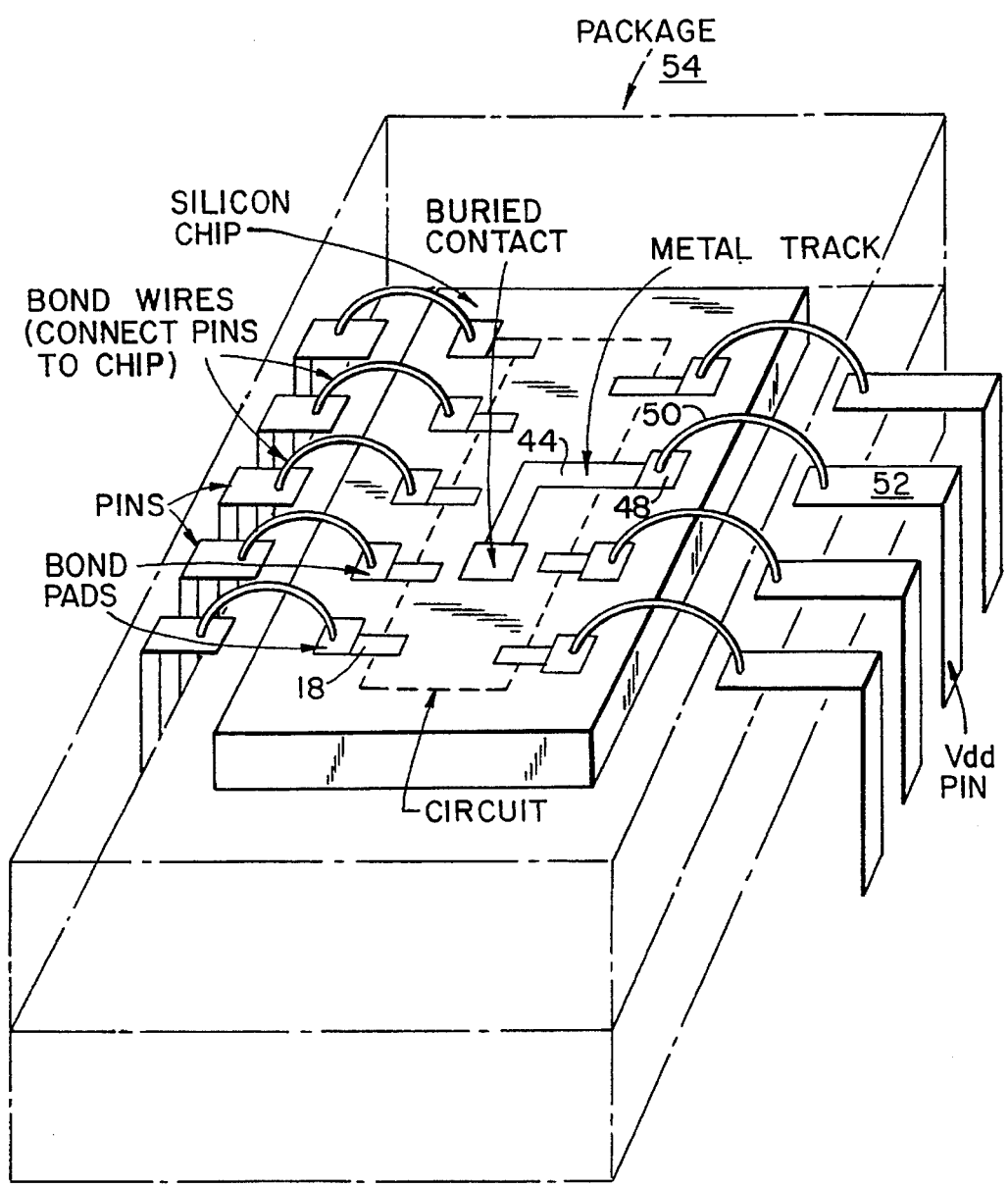
FIG. 2 is a perspective view illustrating how connection is made to the handle wafer contact trench and to the device regions of the IC chip.

Referring also to FIG. 2, electrical connection to the metallization 44 is made through a bond pad 48 and associated wiring 50 to a respective pin 52 of the chip package 54. This pin is in turn connected (in that embodiment) to the positive power supply voltage $V_{DD}$, to fix the handle wafer potential at that end. The device regions 18 of the chip also are connected in the same way to corresponding pins of the package. Thus, it will be seen that establishing contact to the handle wafer 22 uses procedures which are compatible with the normal chip making and contact-forming processes used in making conventional SOI/DI chips.

Figure 3:
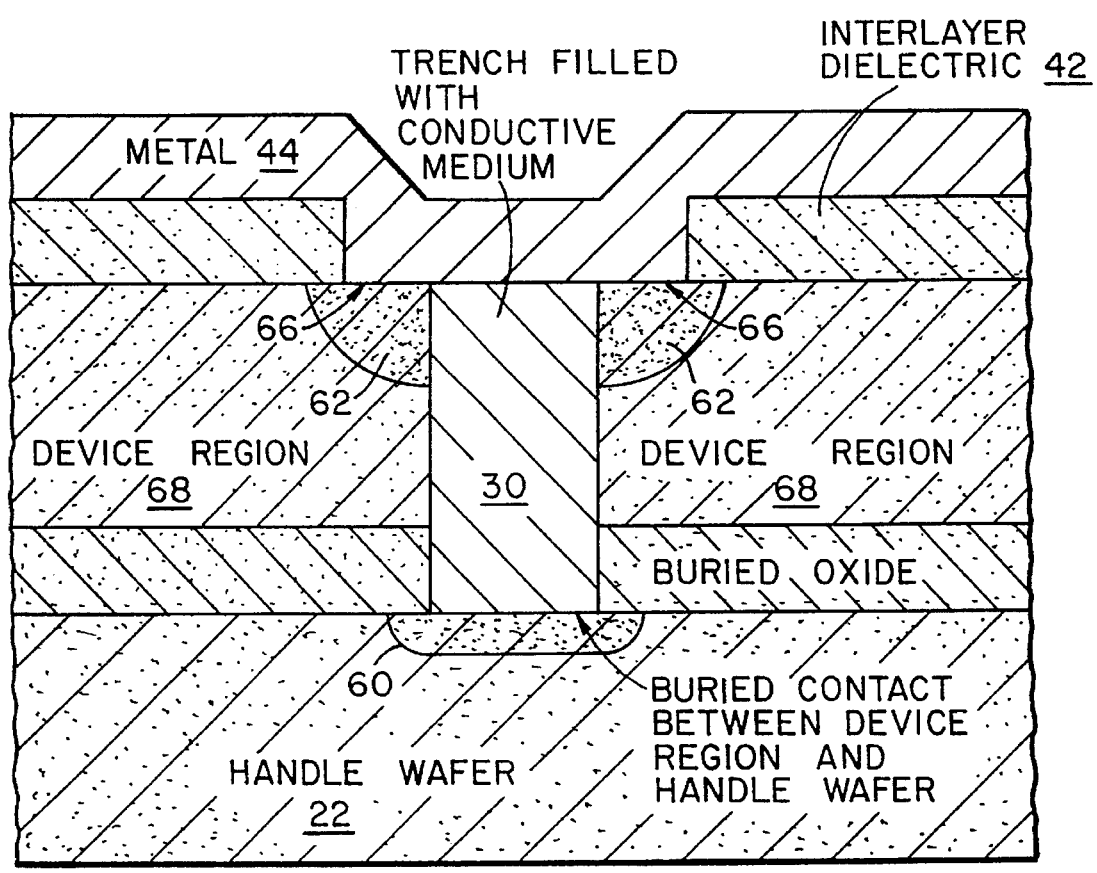
FIG. 3 is a section view of a portion of a completed (IC) chip formed in accordance with the present invention.

FIG. 3 shows details of a handle wafer contact of a completed chip in accordance with this invention. This figure shows that the handle wafer 22 can be diffused with dopant at 60 to enhance the conductivity of the contact between the polysilicon filling 30 and the handle wafer. Such diffusion can be carried out just before filling the trench 10A, i.e., with the chip in the stage illustrated in FIG. 1D. Similar conductivity enhancement can be provided by contact implant diffusions 62 at the upper side regions of the polysilicon filling 30.

Electrical connection to these shoulder regions 62 can be established through contact between the metallization 44 and the horizontal side surfaces 66 of the adjacent device regions 68. With this arrangement, the two adjacent device regions will be dedicated to the function of making contact with the handle wafer, since these regions necessarily will be at the same potential as the handle wafer. Enhanced diffusion down the grain boundaries of the polysilicon contact plug 30 significantly improves the doping level throughout that polysilicon region, leading to a lower resistance of the plug.

It is necessary in the above-described embodiment that the handle wafer 22, the polysilicon fill 30, and the device regions 18 (or 68 in FIG. 3) all comprise the same dopant type (n or p). In this embodiment, the polysilicon fill for all the trenches was undoped when put in place. In the isolation trenches 10, with their sidewall oxide 20, the polysilicon will remain undoped and with very little conductivity. In the contact trench 10A, however, the polysilicon is directly in contact with both the device regions 18 (or 68) and the handle wafer 22, and dopants from those structures can diffuse into the polysilicon freely, thereby providing the higher dopant concentration needed to produce the desired electrical conductivity as described hereinabove.

A rough estimate of the dopant concentration in the fill 30 after such diffusion is between $1 \times 10^{14}$ cm$^{-3}$ and $8 \times 10^{14}$ cm$^{-3}$. The buried contact 60 and the contact implant 62 were doped at a considerably higher level, about $1 \times 10^{19}$ cm$^{-3}$.

Although a preferred embodiment of the invention has been disclosed herein in detail, this has been for the purpose of illustrating the invention, and should not be construed as necessarily limiting the scope of the invention since it is apparent that many changes can be made by those skilled in the art while still practicing the invention claimed herein.

What is claimed is:

1. An integrated-circuit (IC) chip of the type including a first semiconductive section with a number of device regions laterally disposed throughout the section; a layer of insulating material underlying said first semiconductive section; a second semiconductive section underlying said insulating layer and serving as a handle wafer to support said insulating layer and said device regions;

said first semiconductive section being formed with a plurality of first trenches between at least certain of said device regions and extending from the chip surface down through said first semiconductive section to said layer of insulating material;

said first trenches being filled with electrical insulating material which at the bottom of the trench is contiguous to and in contact with said insulating layer thereby to form electrical insulating material surrounding at least one of said device regions;

an additional trench formed in said chip and arranged to extend down through said first semiconductive section and also through said underlying layer of insulation so that its lower extremity penetrates to the region of said second semiconductive region at a depth beneath the lowest regions of said first trenches;

electrically conductive material filling said additional trench and at its lower extremity being engaged with and establishing electrical connection to the material of said second semiconductive section serving as said handle wafer;

metallization means above said additional trench and in contact therewith to establish electrical connection thereto; and means electrically connected to said metallization means to apply a controlling potential through said additional trench to fix the potential of said handle wafer to avoid improper operation of said device regions of the IC chip and to prevent accumulation of damaging electrostatic charges in the handle wafer.

2. An IC chip as claimed in claim 1, including dopant in a region of said second semiconductor section which lies beneath the lower end of said additional trench, thereby to enhance the conductivity of the electrical connection of said conductive filling in said additional trench between said metallization means and said second semiconductive section.

3. An integrated-circuit (IC) chip of the type including a first semiconductive section with a number of device regions laterally disposed throughout the section; a layer of insulating material underlying said first semiconductive section; a second semiconductive section underlying said insulating layer and serving as a handle wafer to support said insulating layer and said device regions;

said first semiconductive section being formed with a plurality of first trenches between at least certain of said device regions and extending from the chip surface down through said first semiconductive section to said layer of insulating material;

said first trenches being filled with electrical insulating material which at the bottom of the trench is contiguous to and in contact with said insulating layer thereby to form electrical insulating material surrounding at least one of said device regions;

an additional trench formed in said chip and arranged to extend down through said first semiconductive section and also through said underlying layer of insulation so that its lower extremity penetrates to the region of said second semiconductive region;

electrically conductive material filling said additional trench and at its lower extremity being engaged with and establishing electrical connection to the material of said second semiconductive section serving as said handle wafer;

said electrically conductive material being engaged on the side surfaces of said additional trench with the device regions adjacent said side surfaces and having electrical continuity therewith so that said adjacent device regions enhance the conductivity of the path through said additional trench to said handle wafer;

metallization means above said additional trench and in contact therewith to establish electrical connection thereto; and means electrically connected to said metallization means to apply a controlling potential through said additional trench to fix the potential of said handle wafer to avoid improper operation of said device regions of the IC chip and to prevent accumulation of damaging electrostatic charges in the handle wafer.

4. An IC chip as claimed in claim 3, wherein said metallization means extends out laterally over the horizontal side surfaces of said adjacent device regions; and contact implant diffusions formed in the portions of said adjacent device regions which are beneath said metallization means.

* * * * *